(12) United States Patent
Lin et al.

(10) Patent No.: US 7,525,153 B2
(45) Date of Patent: Apr. 28, 2009

(54) LATERALLY DOUBLE-DIFFUSED METAL OXIDE SEMICONDUCTOR TRANSISTOR AND METHOD FOR FABRICATING THE SAME

(75) Inventors: Cheng-Chi Lin, Yilan (TW); Shin Su, Hsinchu (TW); Chien-Wen Chu, Taoyuan (TW); Shih-Chin Lien, Taipei (TW); Chin-Pen Yeh, Hsinchu (TW)

(73) Assignee: Macronix International Co., Ltd, Hsinchu (TW)

( * ) Notice: Subject to any disclaimer, the term of this patent is extended or adjusted under 35 U.S.C. 154(b) by 173 days.

(21) Appl. No.: 11/399,427

(22) Filed: Apr. 7, 2006

(65) Prior Publication Data
US 2007/0108520 A1 May 17, 2007

(30) Foreign Application Priority Data
Nov. 7, 2005 (TW) .............................. 94139008 A

(51) Int. Cl.
*H01L 29/94* (2006.01)
(52) U.S. Cl. .................................. 257/343; 257/335
(58) Field of Classification Search ............ 257/335, 257/336, 343–346, E29.256, E29.258, E29.266, 257/E29.268
See application file for complete search history.

(56) References Cited

U.S. PATENT DOCUMENTS

| | | | |
|---|---|---|---|
| 6,794,722 B2 * | 9/2004 | Fujita | 257/386 |
| 7,087,973 B2 * | 8/2006 | Mallikarjunaswamy et al. | 257/493 |
| 2002/0053695 A1 | 5/2002 | Liaw et al. | |
| 2005/0067662 A1 * | 3/2005 | Lee et al. | 257/408 |
| 2006/0001086 A1 * | 1/2006 | Pendharkar | 257/335 |
| 2007/0034944 A1 * | 2/2007 | Xu et al. | 257/335 |

* cited by examiner

*Primary Examiner*—Zandra Smith
*Assistant Examiner*—Paul E Patton
(74) *Attorney, Agent, or Firm*—Birch, Stewart, Kolasch & Birch, LLP

(57) ABSTRACT

The present invention discloses a laterally double-diffused metal oxide semiconductor transistor (LDMOS) and a method for fabricating the same. The LDMOS includes a substrate, a first well, a drain, a second well and a source. The substrate includes a first conductive dopant. The first well includes a second conductive dopant and formed in a part of the substrate, and the drain is located in the first well. The second well includes the first conductive dopant and formed in another part of the substrate, and the source located in the second well. The source includes a lightly doped region and a heavily doped region extending downwardly from a top surface of the substrate. The depth of the lightly doped region is more than the depth of the heavily doped region.

7 Claims, 19 Drawing Sheets

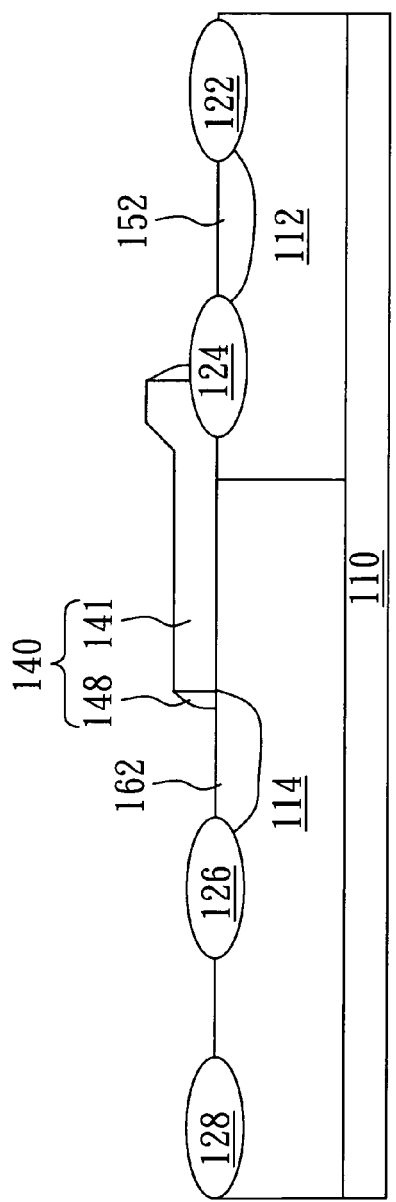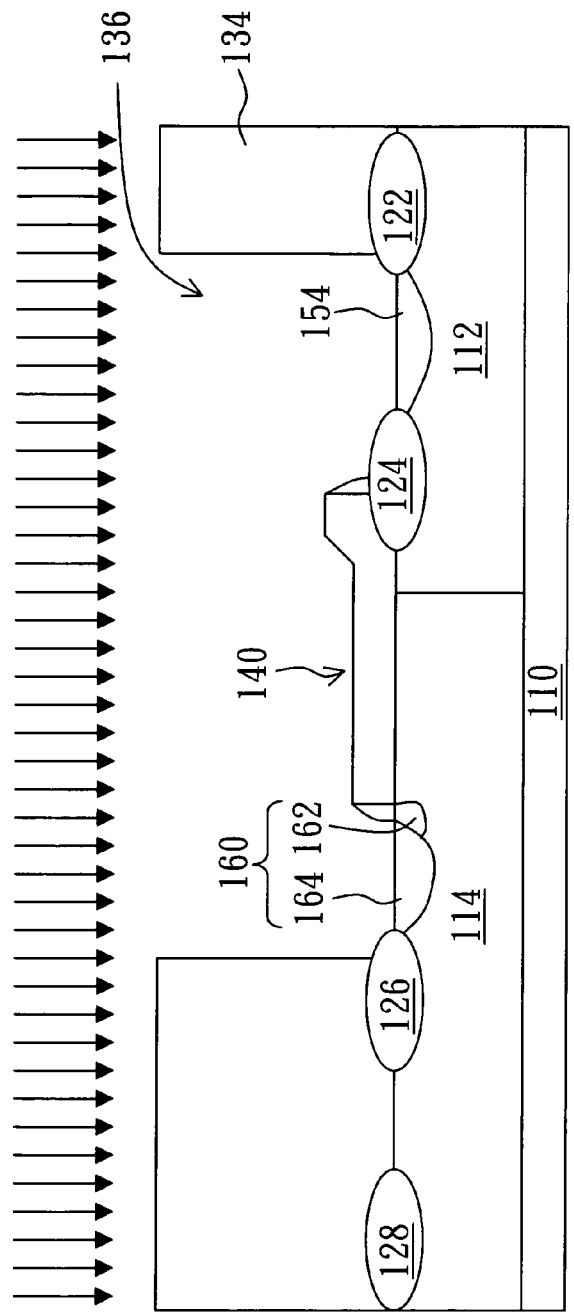

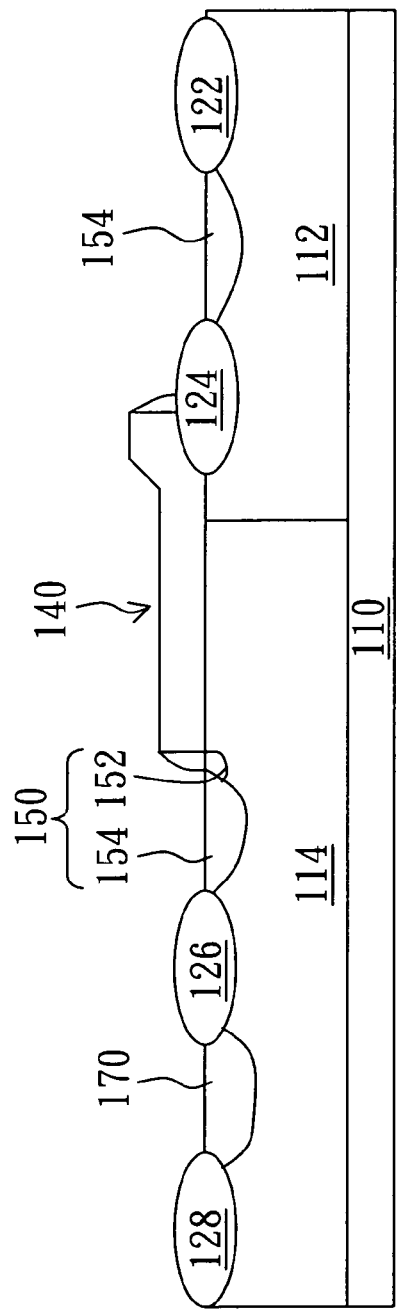
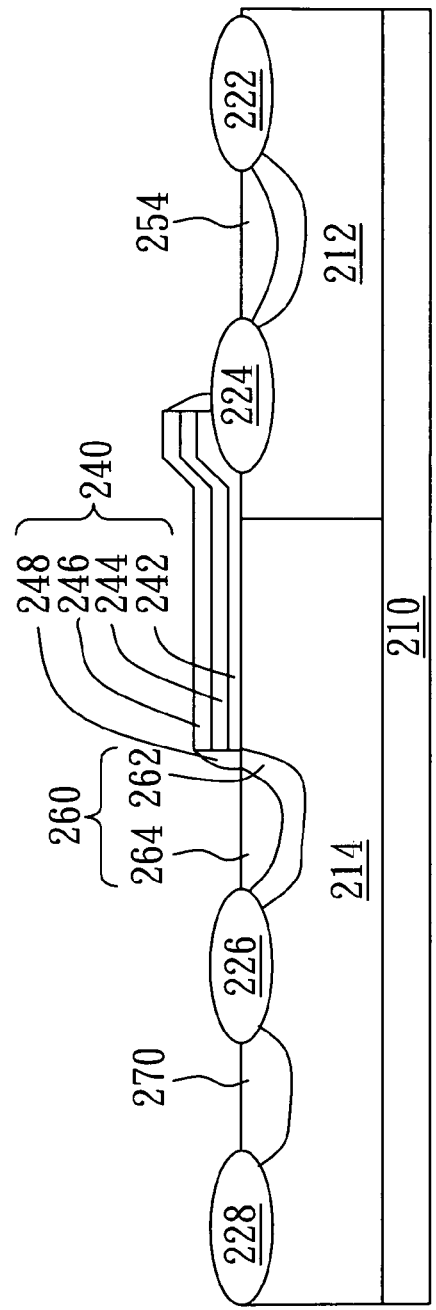
FIG. 1G
FIG. 2

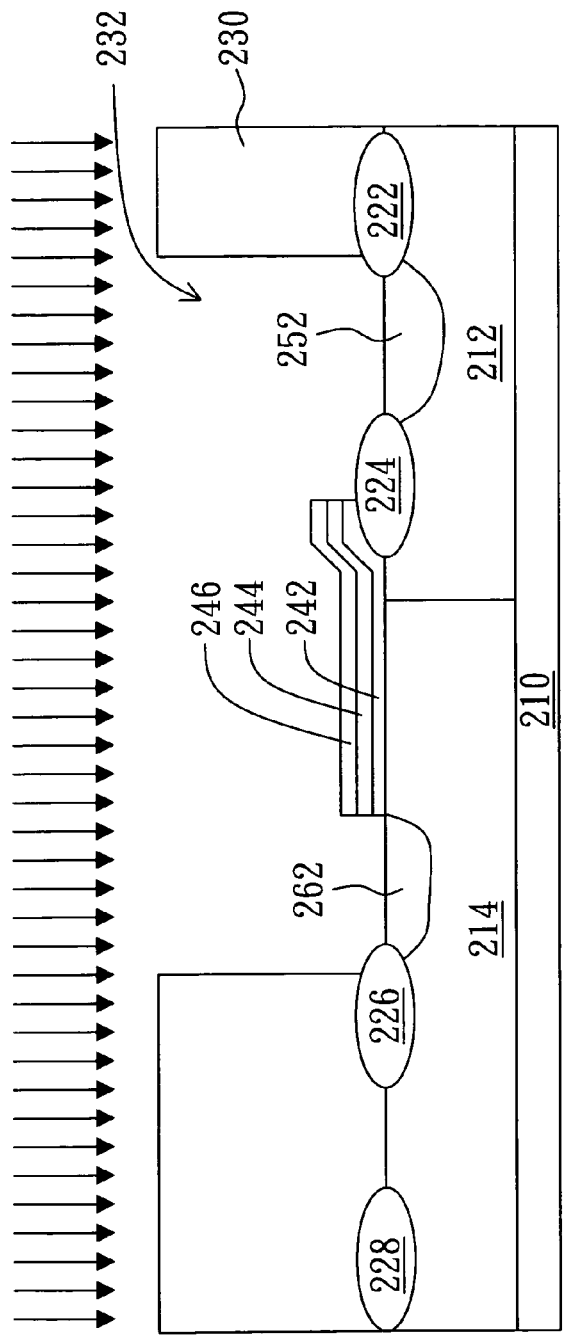
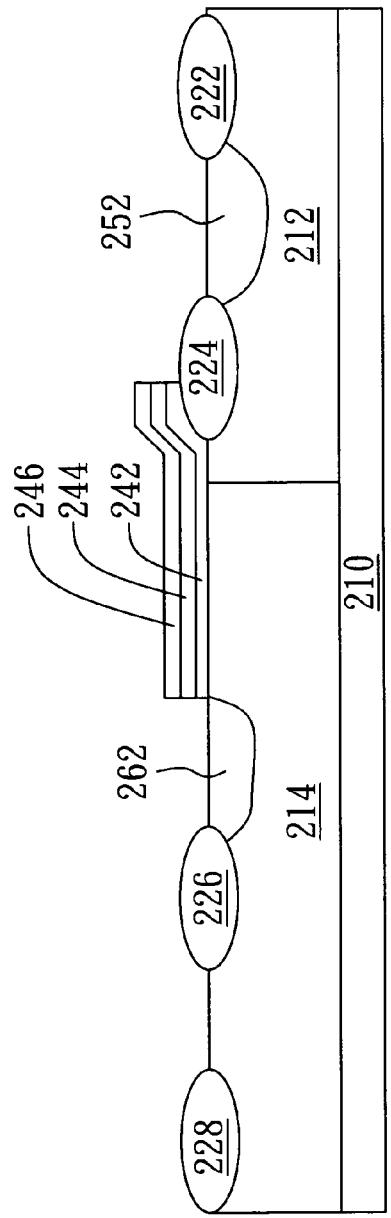
FIG. 3I
FIG. 3J

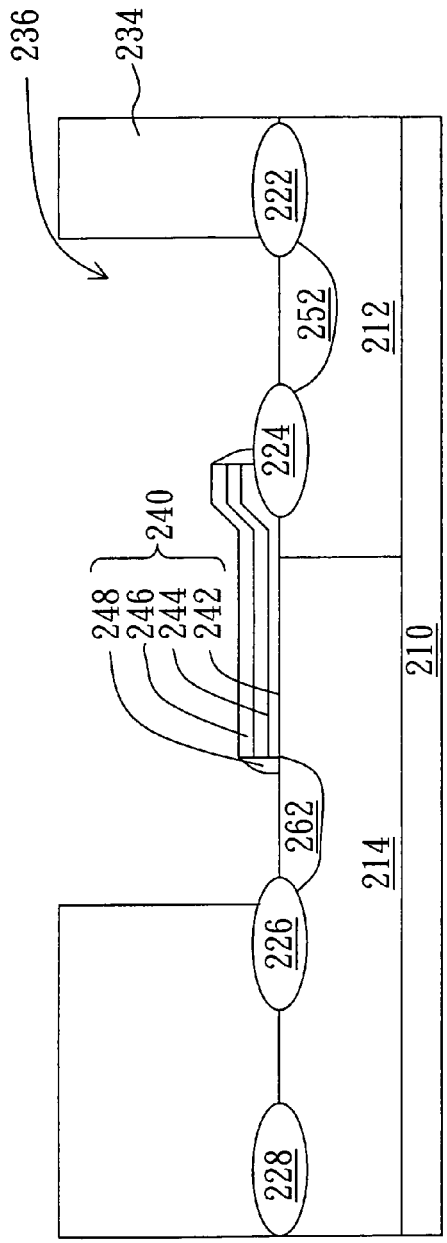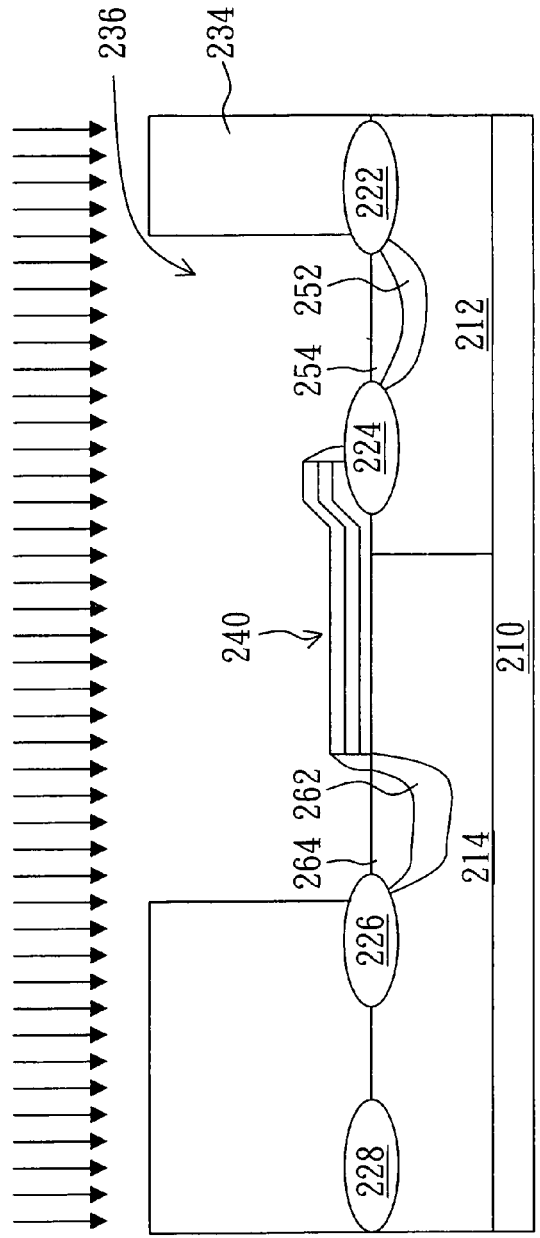

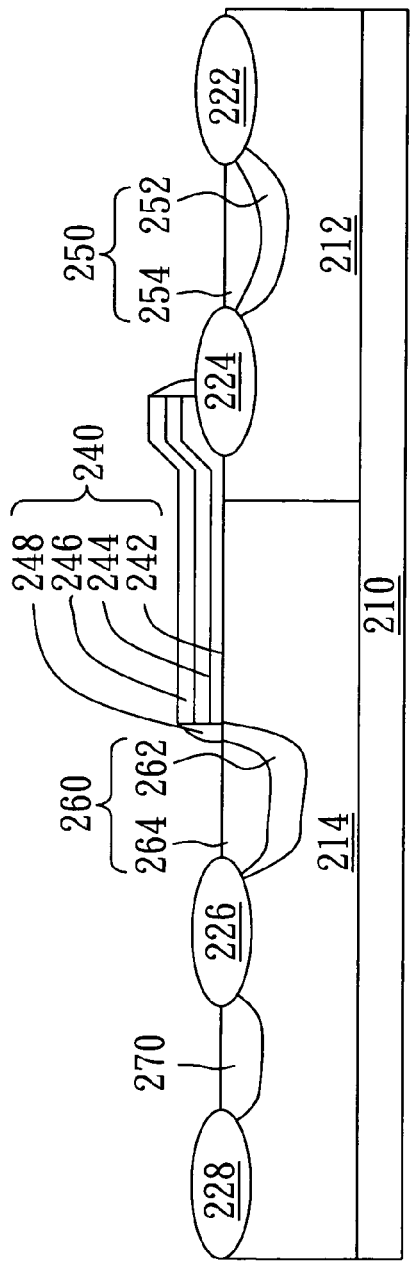
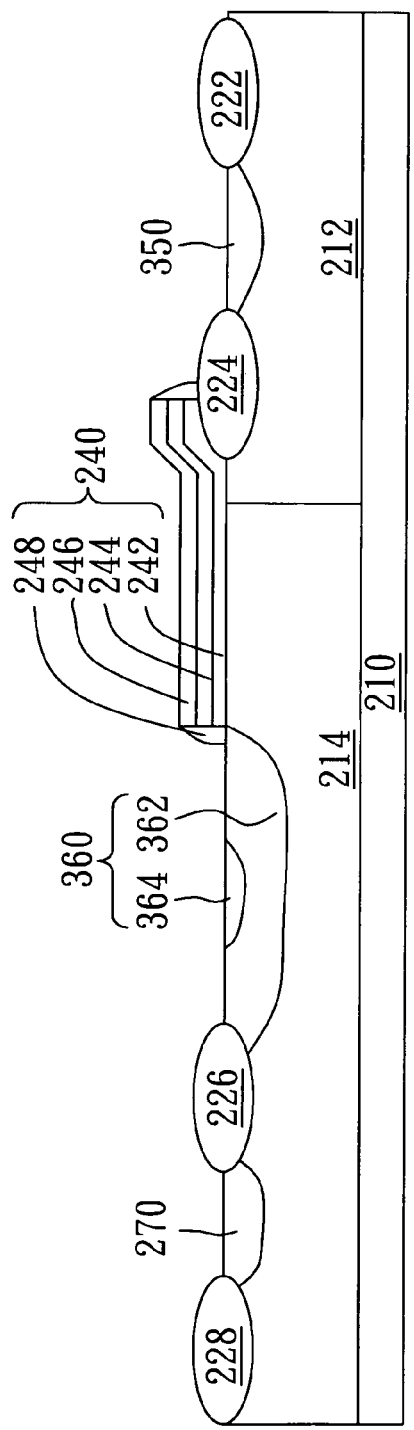
FIG. 3Q
FIG. 4

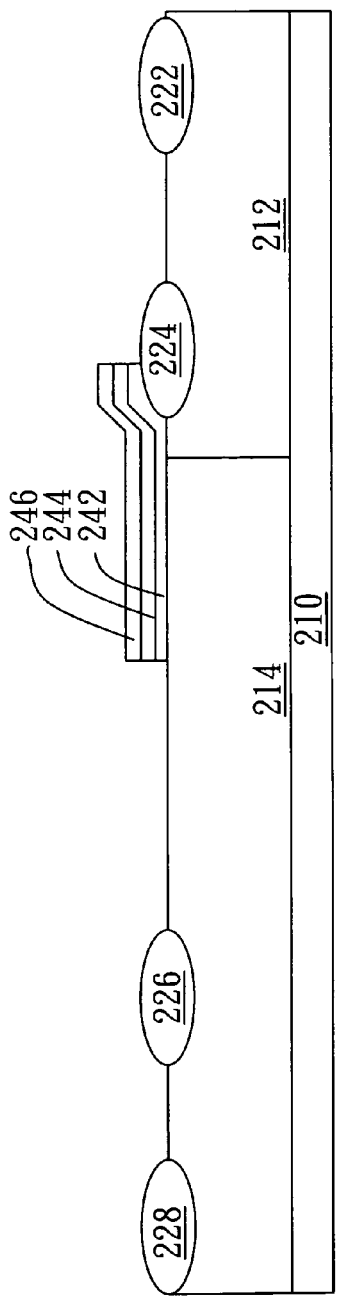
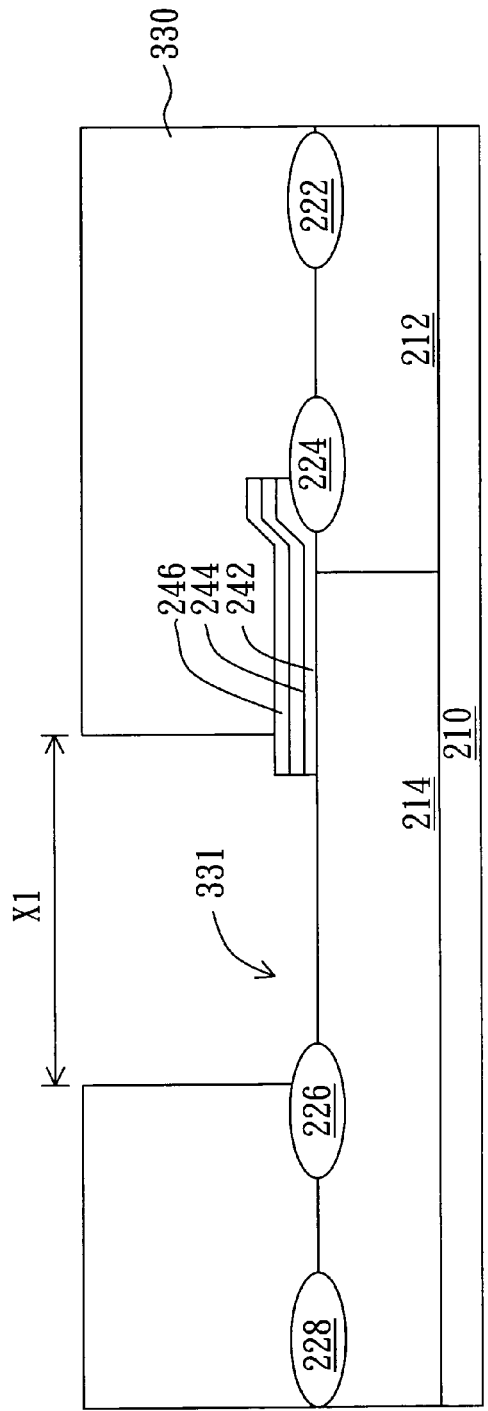
FIG. 5A
FIG. 5B

US 7,525,153 B2

LATERALLY DOUBLE-DIFFUSED METAL OXIDE SEMICONDUCTOR TRANSISTOR AND METHOD FOR FABRICATING THE SAME

This application claims the benefit of Taiwan application Serial No. 94139008, filed Nov. 7, 2005, the subject matter of which is incorporated herein by reference.

BACKGROUND OF THE INVENTION

1. Field of the Invention

The invention relates in general to a laterally double-diffused metal oxide semiconductor transistor (LDMOS) and method for fabricating the same, and more particularly to a laterally double-diffused metal oxide semiconductor transistor (LDMOS) comprising a double diffused source and a method for fabricating the same.

2. Description of the Related Art

When the size of the semiconductor is shrink, the channel between the source and drain is also reduced so as to speed up the operating rate of the whole transistor. However, if the channel of the metal oxide semiconductor transistor (MOS) is shortened, several problems, such as hot carrier effect, will happen.

In general, one of the resolution has been widely used is that adding a doped region at the junction of the channel and the drain/source, and doped concentration of this region is less than the source/drain. This is so called a lightly doped drain (LDD) structure.

Referring to FIGS. 1A~1G, they are cross sectional view illustrating the conventional method for fabricating a laterally double-diffused metal oxide semiconductor transistor (LDMOS). The method for fabricating LDMOS includes following steps.

Firstly, a P type substrate 110 is provided, a N type first well 112 is formed on a part of the substrate 110, and a P type second well 114 is formed on another part of the substrate 110, as shown in FIG. 1A.

Next, several field oxide films (FOXs) are formed on a top surface of the substrate 110; a first FOX 122 and a second FOX 124 thereof are located in the first well 112, and a third FOX 126 and forth FOX 128 thereof are located in the second well 114 as shown in FIG. 1B.

Then, a gate 141 is formed on a part of the substrate 110 and a part of the second FOX 124 as shown in FIG. 1C.

Afterward, a drain is formed in the first well 112, and a lightly doped region is also formed in the second well 114 by self-alignment process, which includes following steps. A patterned photoresist layer 130 is formed by using a mask on the substrate 110, and the patterned photoresist layer 130 has an aperture 132 to expose the substrate 110 which is located between the first and third field oxide film 122 and 126, as shown in FIG. 1D. Then, ion implantation is performed by implanting the N type dopant into the substrate 110 to form the lightly doped region 162 of the source and the lightly doped region 152 of the drain, as shown in FIG. 1D.

After the patterned photoresist layer 130 is removed, the spacer 148 is formed on the side of the gate 141 to form the gate structure 140 as shown in FIG. 1E. Another patterned photoresist layer 134 of the same patterned is then formed on the substrate 110 with the same mask, and the ion implant process is performed as shown in FIG. 1F. N type dopant of high concentration is implanted into the substrate 110 which is masked by the gate structure 140 so as to form a heavily doped region 164 of the source and lightly doped region 154 of the drain. During the ion implant process, the lightly doped region 152 completely overlaps the heavily doped region 154 of the drain, but the lightly doped region 162 partially overlaps the heavily doped region 164 so that the lightly doped region 162 which is positioned beneath the spacer 148 projects from a laterally side of the heavily doped region 164 of the drain. Therefore, the structure of lightly doped drain (LDD) is formed by the self-alignment process.

After the patterned photoresist layer 134 is removed, P type dopant is implanted into the substrate 110 as a P type doped well 170, and a laterally double diffused metal oxide semiconductor conductor 100 is completed as shown in FIG. 1G.

However, hot carrier effect can't be solve by the structure of lightly doped drain, and the operating voltage of the transistor must be restricted to be under certain amount or else electrical breakdown will happen. When the operating voltage of the transistor is over the critical amount, the transverse electrical field increases and hot electrons are generated in the channel. Hot electrons having energy corrodes the drain and generated many electron and hole pairs, so that the amounts of carriers in the channel and near the drain is increased, as so called carrier multiplication. A part of generated electrons are usually attracted towards the drain to raise the current in the drain, and a part of electrons inject to the gate oxide layer. A part of generated holes flow to the substrate, as so called substrate current, and a part of holes are collected by the drain and enforce the NPN phenomenon that facilitates carrier multiplication and causes electrical breakdown finally.

SUMMARY OF THE INVENTION

It is therefore an object of the invention to provide a laterally double diffused metal oxide semiconductor transistor (LDMOS) comprising a source whose structure is double-diffused drain (DDD), which can improve the hot carrier effect and raise the driving voltage of the source.

The invention achieves the above-identified object by providing a laterally double-diffused metal oxide semiconductor transistor (LDMOS), comprising a substrate, a first well, a drain, a second well and a source. The substrate includes a first conductive dopant. The first well includes a second conductive dopant and formed in a part of the substrate, and the drain is located in the first well. The second well includes the first conductive dopant and formed in another part of the substrate, and the source located in the second well. The source includes a lightly doped region and a heavily doped region extending downwardly from a top surface of the substrate. The depth of the lightly doped region is more than the depth of the heavily doped region.

Moreover, the invention achieves the above-identified object by providing a method for fabricating a laterally double-diffused metal oxide semiconductor transistor (LDMOS), comprising: (a) providing a substrate comprising a first conductive dopant; (b) forming a first well comprising a second conductive dopant in a part of the substrate; (c) forming a second well comprising a first conductive dopant in another part of the substrate; (d) forming a plurality of field oxide films (FOXs) on a top surface of the substrate, wherein a first FOX and a second FOX thereof are located in the first well, and a third FOX thereof is located in the second well; (e) forming a gate structure on a part of the substrate and a part of the second FOX; (e forming a drain in the first well; and (g) forming a source in the second well, the source comprising a lightly doped region and a heavily doped region extending downwardly from the top surface of the substrate, wherein the depth of the lightly doped region is more than the depth of the heavily doped region.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIGS. 1A~1G (prior art) schematically depict cross sectional view illustrating the conventional method for fabricating a laterally double-diffused metal oxide semiconductor transistor (LDMOS);

FIG. 2 schematically depicts a cross sectional view illustrating a laterally double diffused metal oxide semiconductor transistor (LDMOS) according to the first embodiment of the invention;

FIG. 4 schematically depicts a cross sectional view illustrating a laterally double diffused metal oxide semiconductor transistor according to the second embodiment of the invention;

FIGS. 5A~5I schematically depict cross sectional view illustrating the method for fabricating the source and drain of the LDMOS according to the second embodiment of the present invention.

DETAILED DESCRIPTION OF THE INVENTION

Figure 1A:
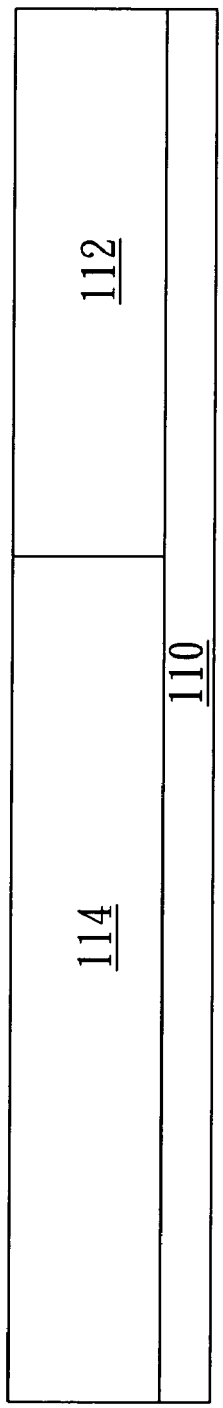
Figure 1B:
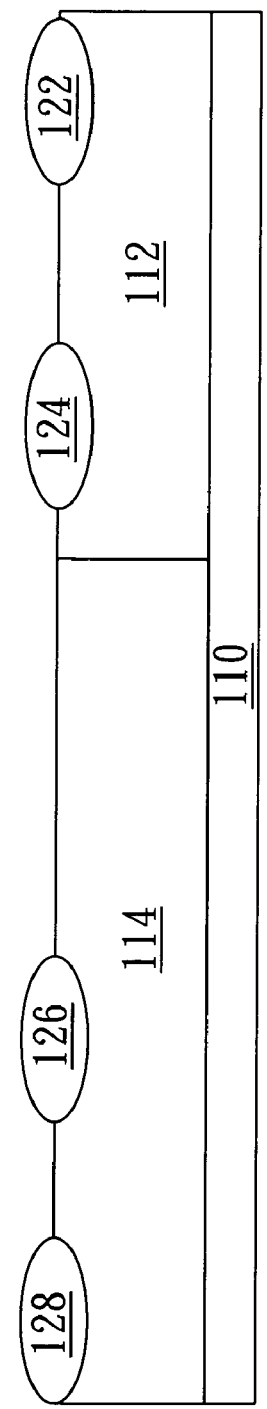
Figure 1C:
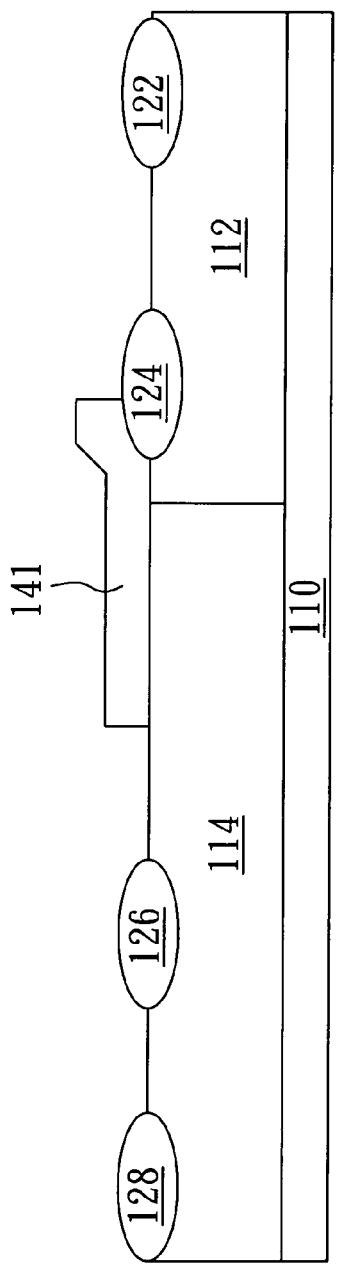
Figure 1D:
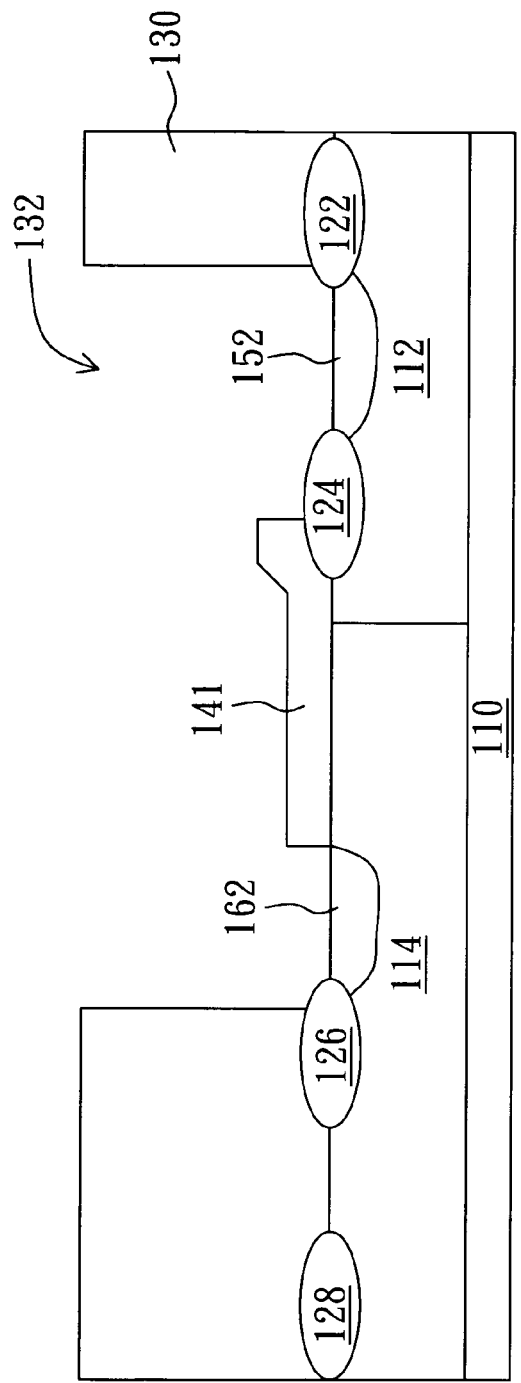

The main idea of the present invention is providing a laterally double diffused metal oxide semiconductor transistor (LDMOS) comprising a source having a double diffused drain (DDD) structure, which including a heavily doped region and a lightly doped region deeper than the heavily doped region. The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. A LDNMOS, that is n type LDMOS, is taken for example in the following embodiments, but one skilled in the art realized that it is not limited to the NMOS, and it may also be applied to PMOS and CMOS.

FIRST EMBODIMENT

Referring to FIG. 2, it is a cross sectional view illustrating a laterally double diffused metal oxide semiconductor transistor (LDMOS) according to the first embodiment of the invention. The LDMOS 200 of the present embodiment includes a substrate 210, a first well 212, a second well 214, several field oxide films (FOX) 222, 224, 226, and 228, a gate structure 240, a drain 250 and source 260. The substrate 210 includes a first conductive dopant, for example, the substrate 210 is a P type substrate if the LDMOS is an N type LDMOS. The first well 212 includes a second conductive dopant, such as N type dopant, and is formed in a part of the substrate 210. The second well 214 comprises a first conductive dopant, such as P type dopant, and is formed in another part of the substrate 210. Field oxide films (FOXs) are formed on the substrate 210; a first FOX 222 and a second FOX 224 of these FOXs are located in the first well 212, and a third FOX 226 of these FOXs is located in the second well 214. The gate structure 240 is disposed on a part of the substrate 210 and a part of the second FOX 224. The gate structure 240 includes a gate and a spacer 248, and the gate includes a gate oxide layer 242, a polysilicon layer 244, and a metal layer 246. The gate oxide layer 242 is formed on the a part of the substrate 210 and on a part of the second FOX 224, preferably above a channel which is a region between the source 260 and the drain 250 in the substrate 210. The polysilicon layer 244 is formed on the gate oxide layer 242. The metal layer 246, such as metal silicide layer, is formed on the polysilicon layer. The spacer 248 is formed on a sidewall of the gate. The drain 250 is located in the first well 212. The source 260 is located in the second well 214, and the source 260 has a lightly doped region 262 and a heavily doped region 264 extending downwardly from a top surface of the substrate 210, wherein the depth of the lightly doped region 262 is more than the depth of the heavily doped region 264. Preferably, the wideness of the lightly doped region 262 is more than the heavily doped region 264.

Figure 3A:
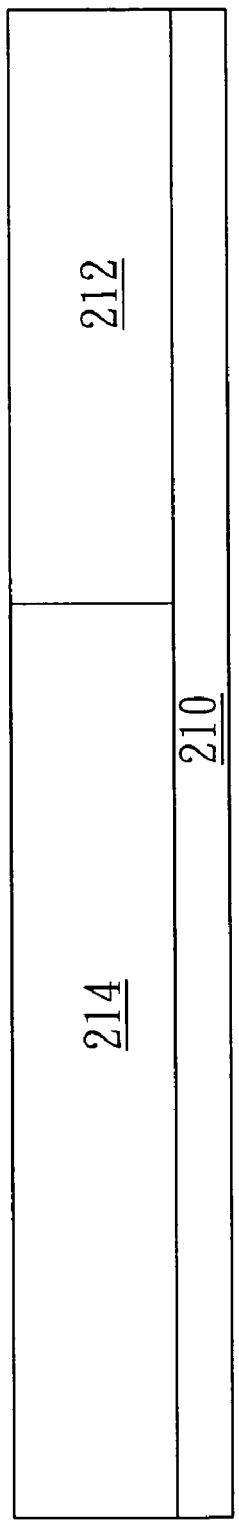
FIGS. 3A~3Q schematically depict cross sectional view illustrating a method for fabricating a laterally double diffused metal oxide semiconductor transistor (LDMOS) according to the first embodiment of the invention.

Referring to FIGS. 3A~3Q, they are cross sectional view illustrating a method for fabricating a laterally double diffused metal oxide semiconductor transistor (LDMOS) according to the first embodiment of the invention. The method for fabricating the LDMOS according to the first embodiment includes following steps.

Firstly, a substrate 210 including the first conductive dopant is provided, a first well 212 including the second conductive dopant is formed in a part of the substrate 210, and a second well 214 including the first conductive dopant is formed in another part of the substrate 210 as shown in FIG. 3A.

Figure 3B:
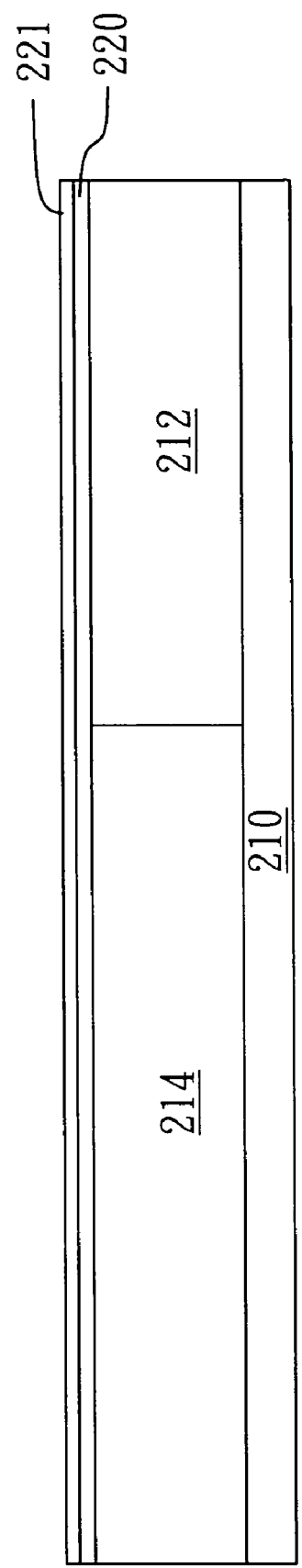
Figure 3C:
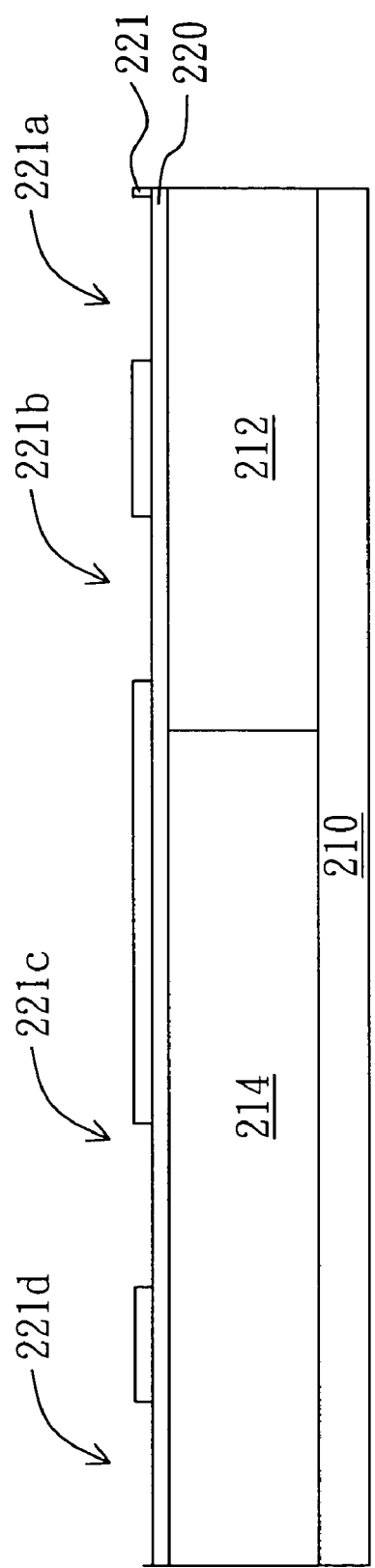
Figure 3D:
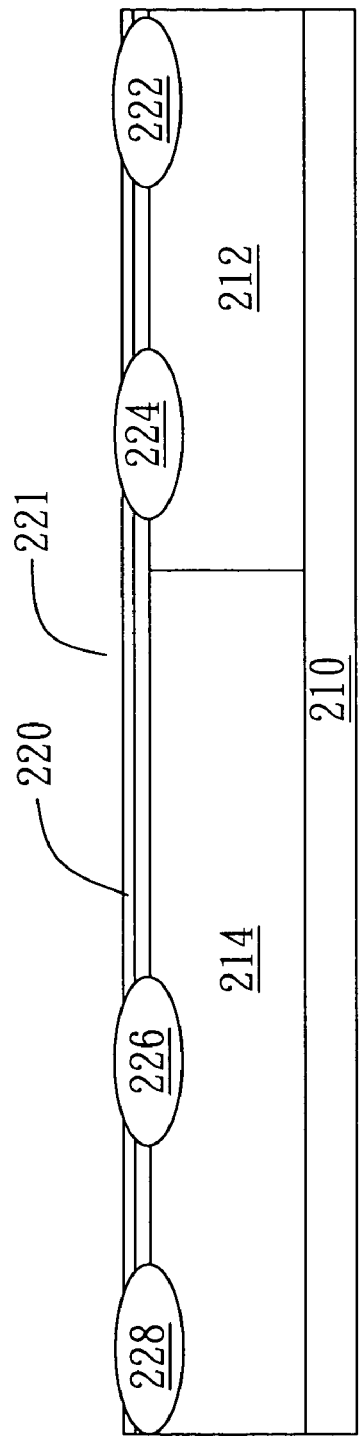
Figure 3E:
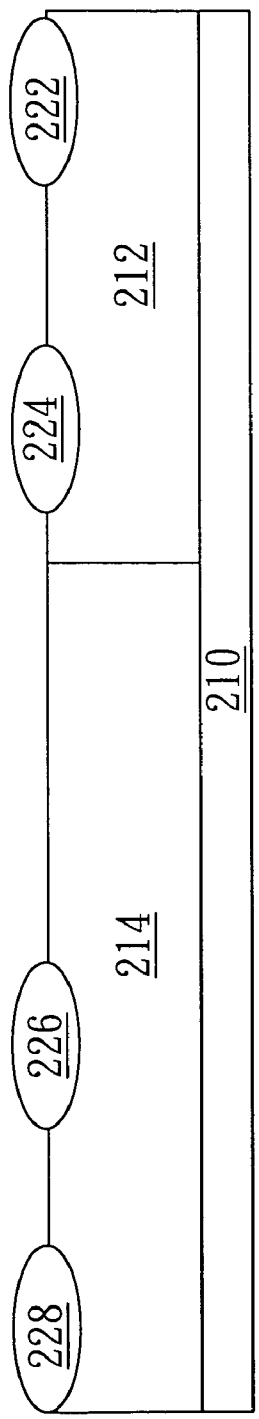

Next, several field oxide films (FOXs) are formed on a top surface of the substrate 210; a first FOX and a second FOX thereof are located in the first well 212, and a third FOX thereof is located in the second well 214. For example, a tetraethylorthosilicate (TEOS) layer 220 is formed on the substrate 220, and a silicon nitride layer ($Si_3N_4$) 221 is formed on the TEOS layer 220 as shown in FIG. 3B. Then, the silicon nitride layer 221 is patterned to form three apertures 221a, 221b, and 221c so as to expose the TEOS layer 220. Two of the three apertures 221a and 221b are located in the first well 212, and the other aperture 221c is located in the second well 214 as shown in FIG. 3C. The silicon nitride layer 221 preferably has the forth aperture 221d located in the second well 214 as shown in FIG. 3C. Next, the substrate 210 is put into the oxidation oven, so the TEOS layer 220 grows into field oxide layers under moist environment. Afterward, the first, second and third field oxide films (FOXs) 222, 224 and 226 are respectively formed in the three aperture 221a, 221b, and 221c on the substrate 210, and the forth filed oxide film (FOX) 228 is preferably formed as shown in FIG. 3D. The first FOX 222 and the second FOX 224 thereof are located in the first well 212, and the third FOX 226 and the forth FOX 228 thereof are located in the second well 214. Finally, the silicon nitride layer 221 and the TEOS layer 220 are removed as shown in FIG. 3E.

Figure 3F:
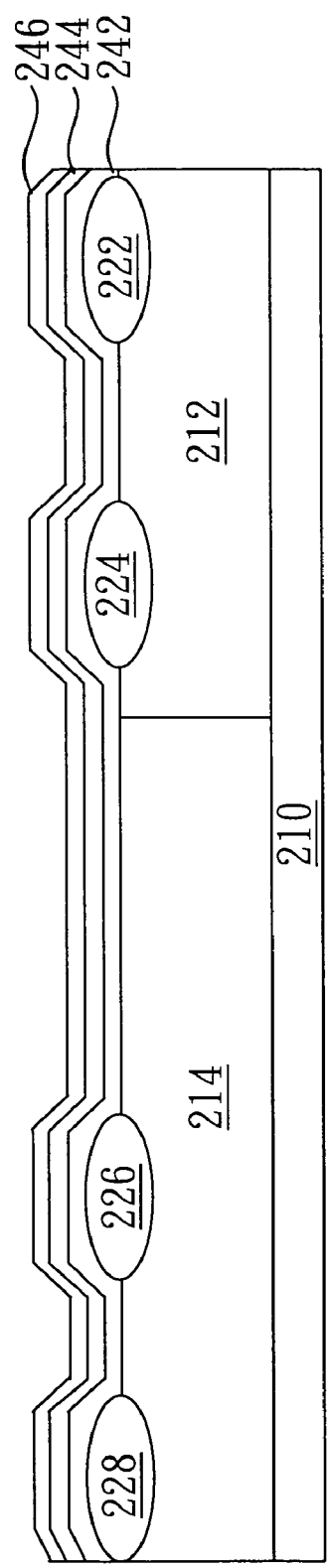

Then, a gate structure is formed on a part of the substrate and a part of the second FOX. The gate structure, for example, is formed as following steps. Firstly, after the gate oxide layer 242 is formed on the substrate 210 and those field oxide films 222, 224, 226, and 228, a polysilicon layer 244 is formed on the gate oxide layer 242, and then a metal silicide layer 246 is formed on the polysilicon layer 244 as shown in FIG. 3F.

Figure 3G:
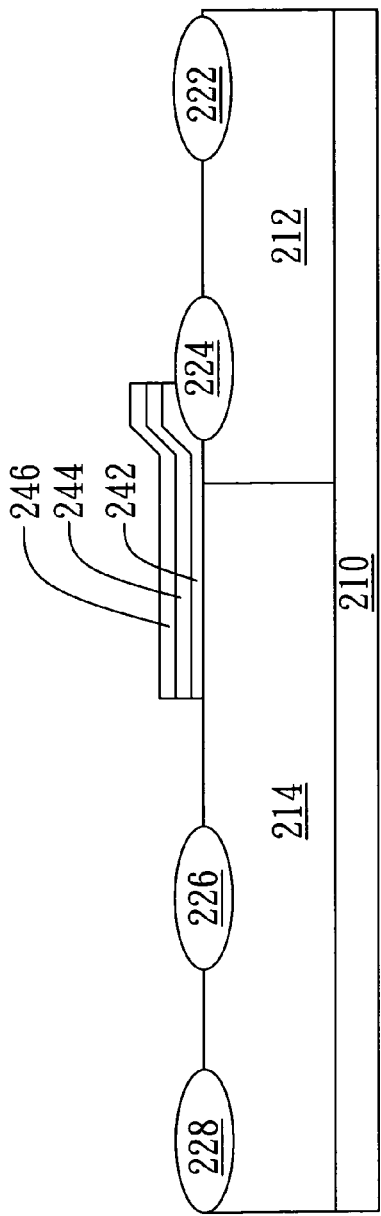

Finally, the metal silicide layer 246, the polysilicon layer 244, and the gate oxide layer 242 are patterned to form a gate. The gate covers a part of the substrate 210 and a part of the second field oxide film 244 as shown in FIG. 3G.

Figure 3H:
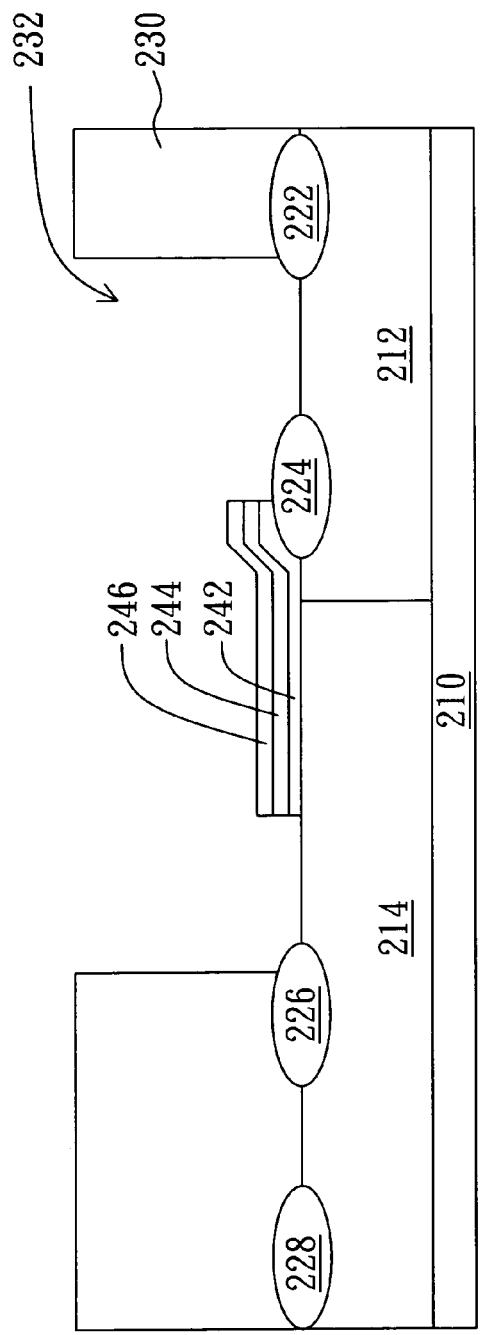
Figure 3K:
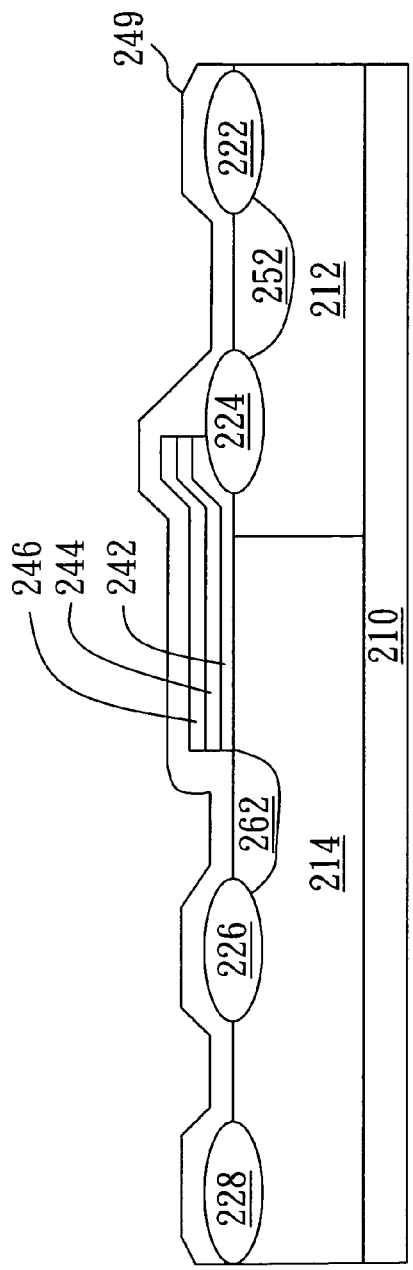
Figure 3L:
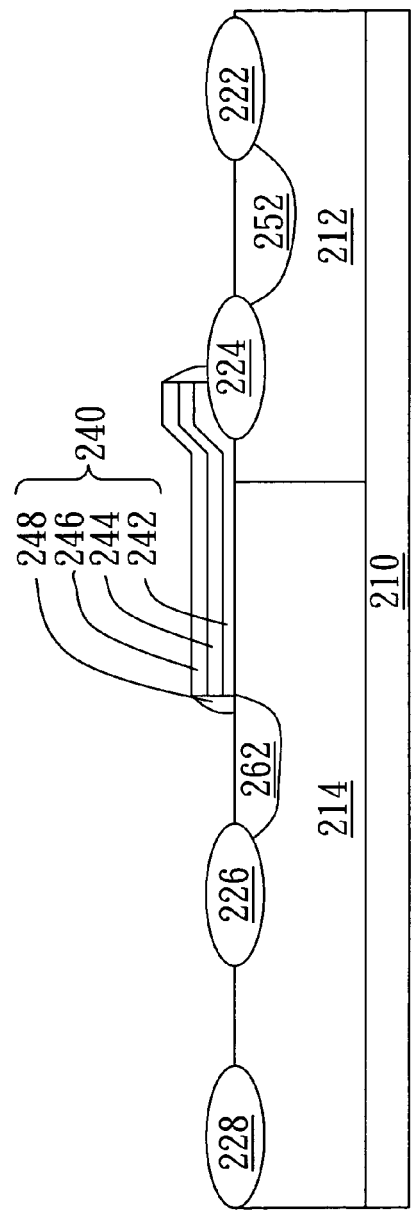

Afterward, a drain if formed in the first well, and a source is formed in the second well. The source includes a lightly doped region and a heavily doped region extending downwardly from a top surface of the substrate, preferably the depth of the lightly doped region is more than the depth of the heavily doped region. For example, the source and the drain are formed as following steps. Firstly, a patterned photoresist layer 230 is formed by using a mask on the substrate 210, and the patterned photoresist layer 230 has an aperture 232 to expose the substrate 210 which is located between the third field oxide film 226 and the gate, as shown in FIG. 3H. The aperture 232 preferably exposes the substrate 210 which is located between the third field oxide film 226 and the first field oxide film 222. Next, a lightly doped region 262 is formed in the substrate 210 by implanting through the aperture 232 with a first power as shown in FIG. 3I. The second conductive dopant, such a N type dopant, of low concentration is therefore implanted into the substrate 210 except the region which is masked by the gate and field oxide films 222, 224, and 226. A lightly doped region 252 of the drain 250 is preferably formed in the substrate 210 at the same time. Then, the patterned photoresist layer 230 is removed as shown in FIG. 3J. Afterward, a silicon oxide layer 249 is deposited on the substrate 210 as shown in FIG. 3K, and then the silicon oxide layer 249 is anisotropically etched so as to form a spacer 248 on the sidewall of the gate as shown in FIG. 3L. The gate structure 240 including the gate and the spacer 248 is formed as stated above. Then, another patterned photoresist layer 234 is formed by using the same mask on the substrate 210, and the patterned photoresist layer 234 has an aperture 236 to expose the substrate 210 which is located between the third field oxide film 226 and the spacer 248 as shown in FIG. 3M. The aperture 236 preferably exposes the substrate 210 which is located between the third field oxide film 226 and the first field oxide film 222. Finally, a heavily doped region 264 is formed in the substrate 210 by implanting through the aperture 236 with a second energy. The second conductive dopant, such a N type dopant, of high concentration is therefore implanted into the substrate 210 except the region which is masked by the gate structure 240 and field oxide films 222, 224, and 226. A heavily doped region 254 of the drain 250 is preferably formed in the substrate 210 at the same time. It is noted that the first power is greater than the second power so as to allow the heavily doped region to be shallower than the lightly doped region. The source including a lightly and a heavily doped region, as so called double diffused drain (DDD) structure, is formed by only one single mask with different implanting power.

Figure 3O:
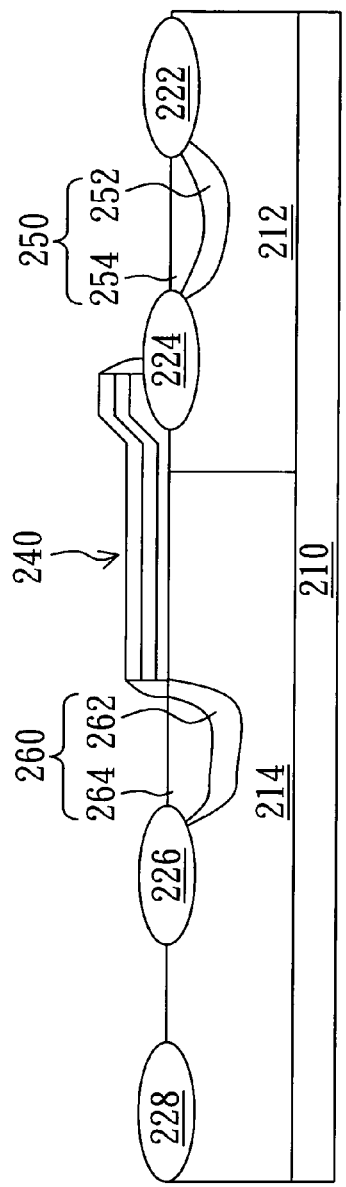
Figure 3P:
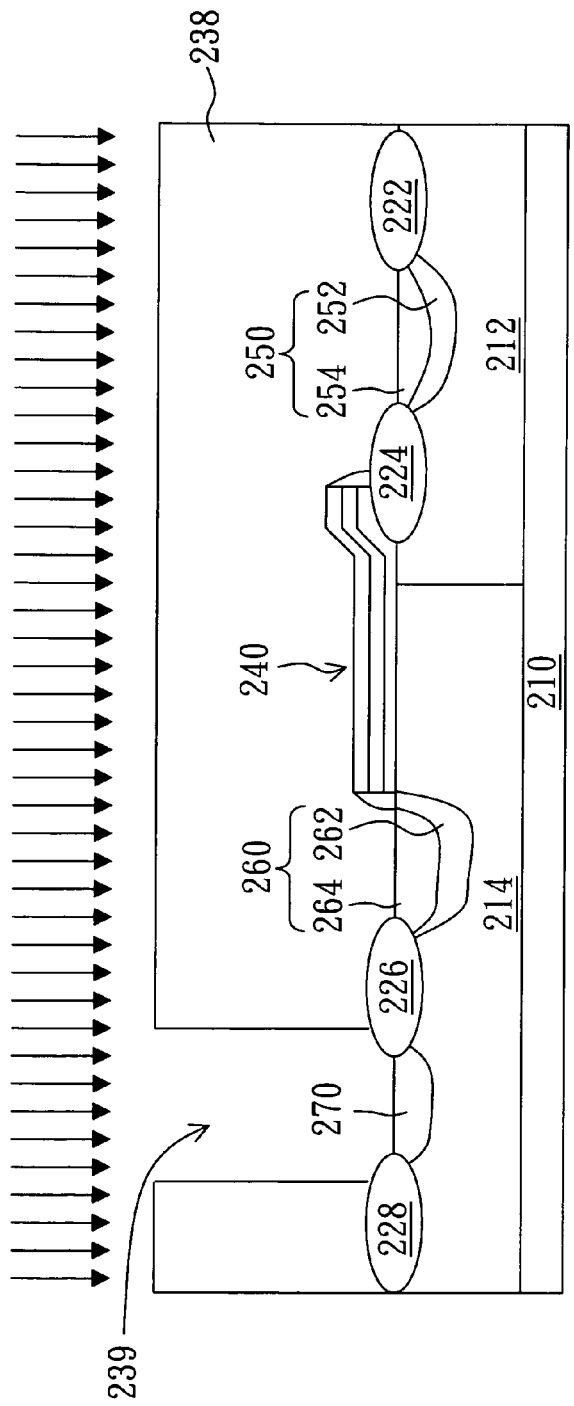

Then, the patterned photoresist layer 234 is removed as shown in FIG. 3O. Next, a patterned photoresist layer 238 is formed by using another mask over the substrate 210, and the patterned photoresist layer 238 has an aperture 239 to expose the substrate 210 which is located between the third field oxide film 226 and the forth field oxide film 228, as shown in FIG. 3P. Next, a first doped well 270 is formed by implanting the first conductive dopant, such as P type dopant, into the substrate 210. Finally, the patterned photoresist layer 238 is removed so as to complete the LDMOS 200 as shown in FIG. 3Q.

SECOND EMBODIMENT

The difference between the laterally double diffused metal oxide semiconductor transistor (LDMOS) of the present embodiment and the LDMOS of the first embodiment is the source and drain, and the fabricating method is therefore different. The same piece remains numerically labeled the same in the following drawings.

Referring to FIG. 4, it is a cross sectional view illustrating a laterally double diffused metal oxide semiconductor transistor according to the second embodiment of the invention.

The LDMOS 300 of the present embodiment includes a substrate 210, a first well 212, a second well 214, several field oxide films (FOX) 222, 224, 226, and 228, a gate structure 240, a drain 350 and source 360. The drain 350 is located in the first well 212. The source 360 is located in the second well 214, and the source 360 has a lightly doped region 362 and a heavily doped region 364 extending downwardly from a top surface of the substrate 210, wherein the depth of the lightly doped region 362 is more than the depth of the heavily doped region 364. Preferably, the wideness of the lightly doped region 362 is more than the heavily doped region 364.

Preferably, the third field oxide film 226 is separated from the heavily doped region 364 by a distance. More preferably, the gate structure 240 that surrounds by the spacer 248 is separated from the heavily doped region 364 by a distance.

The difference between the method for fabricating the LDMOS of the present embodiment and that of the first embodiment is the step of forming the source and drain, so we focus on the step in following paragraphs. Referring to FIGS. 5A~5Q, they are cross sectional view illustrating the method for fabricating the source and drain of the LDMOS according to the second embodiment of the present invention.

Firstly, a substrate 210 including a first well 212 and a second well 214 is provided. The first well 212 includes a first field film (FOX) 222 and a second FOX 224, and the second well 214 includes a third FOX 226 and a forth FOX 228, as shown in FIG. 5A. A gate structure, including a gate oxide layer 242, a polysilicon layer 244, and a metal silicide layer 266, is formed on a part of the substrate 210 and a part of the second FOX 224.

Next, a patterned photoresist layer 330 is formed by using a first mask on the substrate 210, and the patterned photoresist layer 330 has a first aperture 331 to expose the substrate 210 which is located between the third field oxide film 226 and the gate, as shown in FIG. 5B.

Figure 5C:
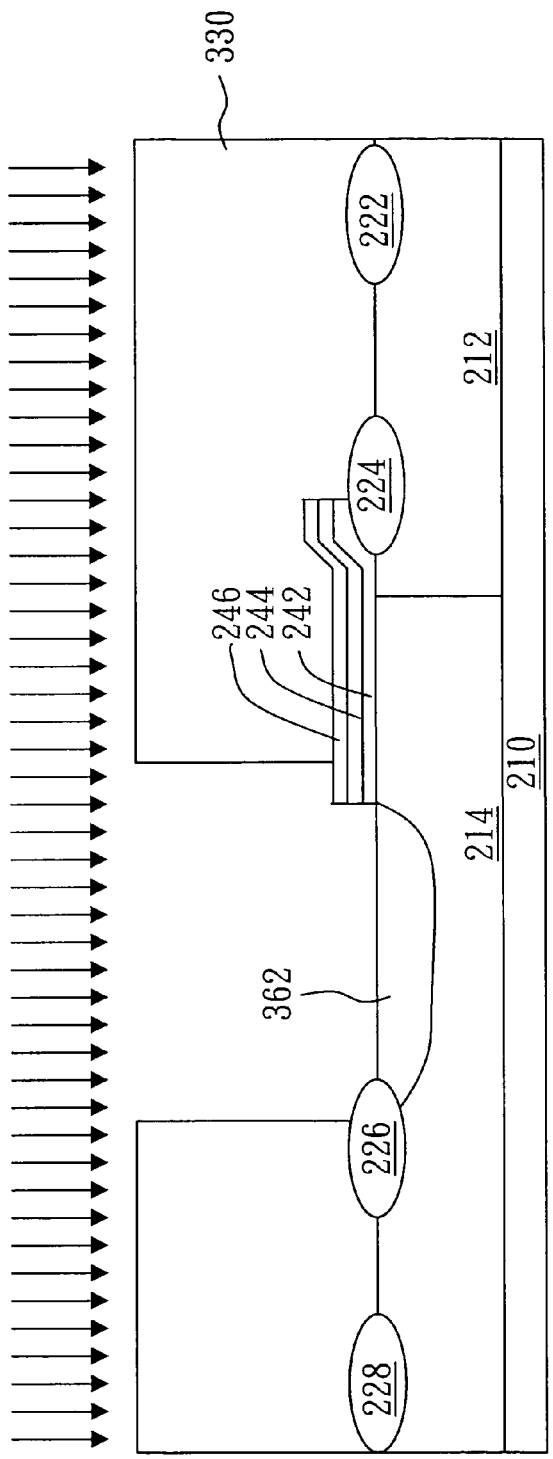

Then, a lightly doped region 362 is formed in the substrate 210 by ion implanting the substrate 210 through the first aperture 331 as shown in FIG. 5C. The second conductive dopant, such a N type dopant, of low concentration is therefore implanted into the substrate 210 except the region which is masked by the gate and field oxide films 222, 224, and 226.

Figure 5D:
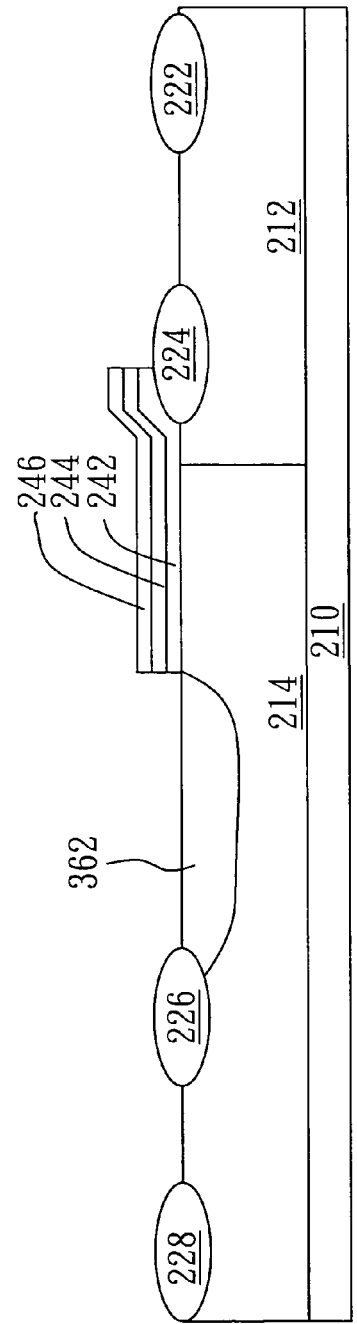

Afterward, the patterned photoresist layer 330 is removed, as shown in FIG. 5D.

Figure 5E:
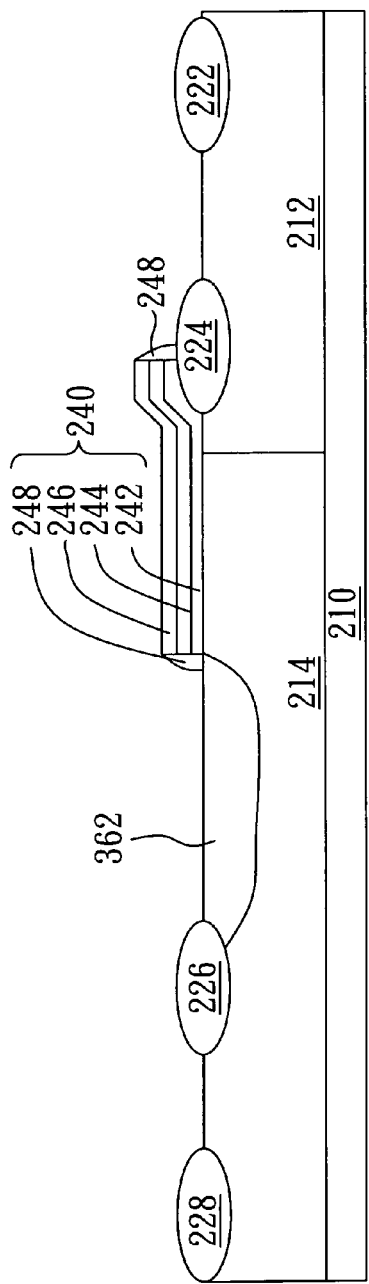

Then, a silicon oxide layer 249 is deposited on the substrate 210, and then anisotropically etched so as to form a spacer 248 on the sidewall of the gate as shown in FIG. 5E. The gate structure 240 including the gate and the spacer 248 is formed as stated above.

Figure 5F:
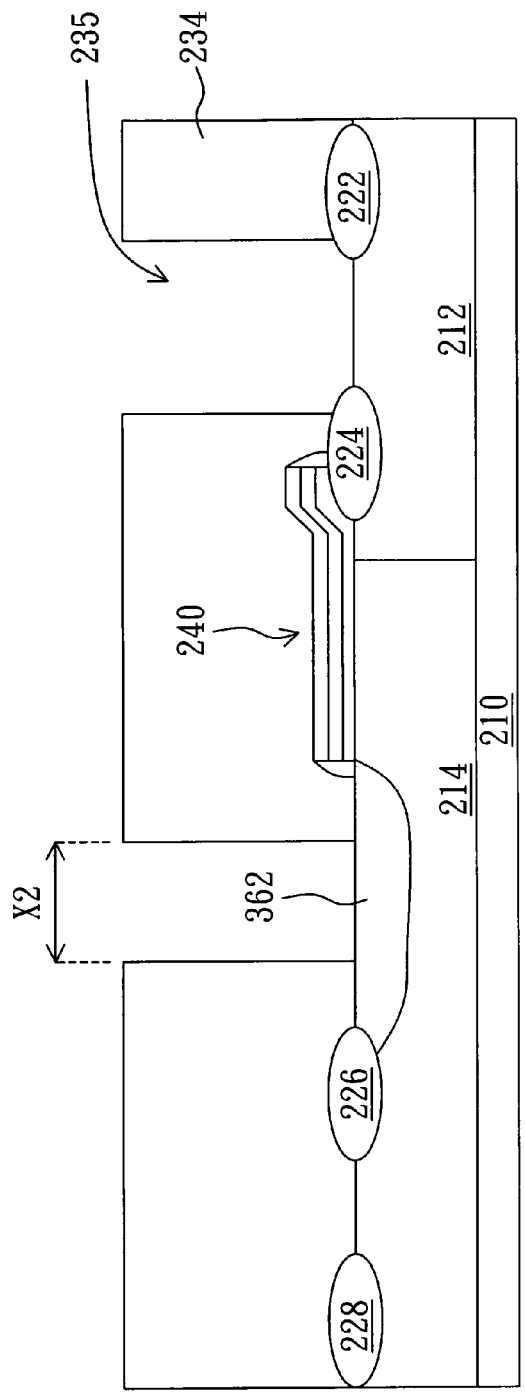

Then, another patterned photoresist layer 334 is formed on the substrate 210 by using the second mask, and the patterned photoresist layer 334 has a second aperture 336 to expose substrate 210 which is located between the third field oxide film (FOX) 226 and the spacer 248 as shown in FIG. 5F. The patterned photoresist layer 334 preferably has another aperture 335 to expose substrate 210 which is located between the first FOX 222 and the second FOX 224. Referring both FIG. 5B and FIG. 5F, the wideness X2 of the second aperture 336 is less than the wideness X1 of the first aperture 331.

Figure 5G:
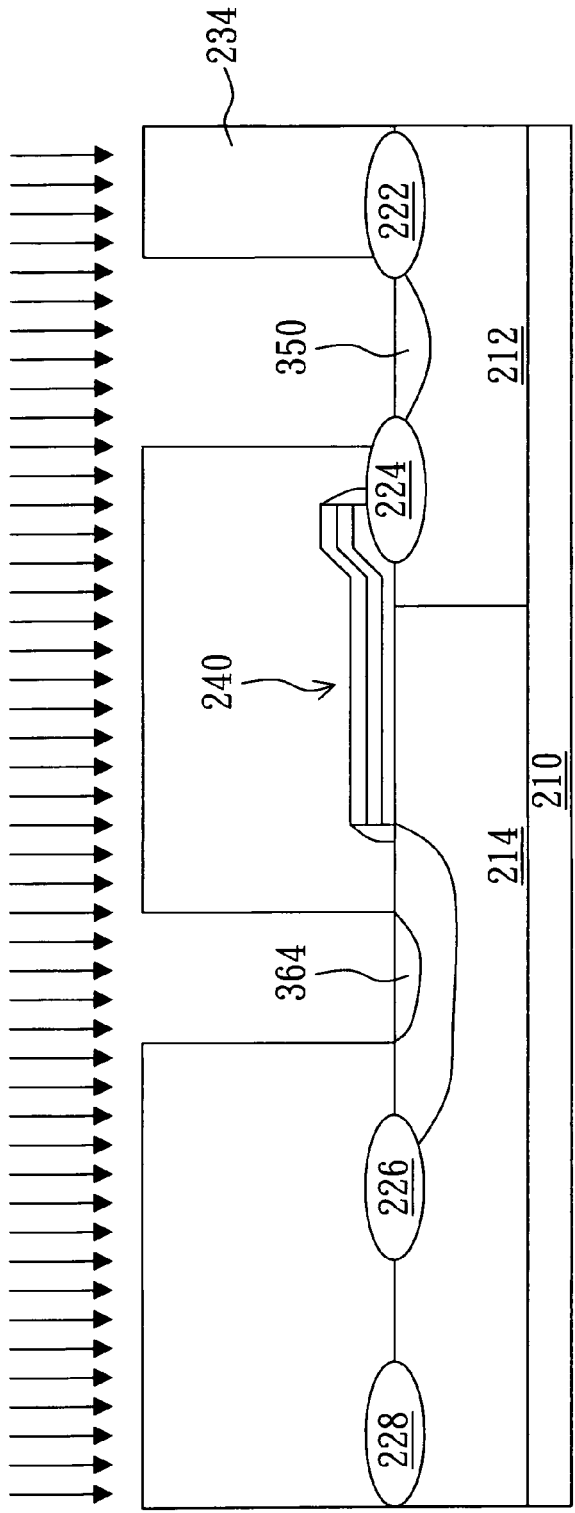

Afterward, a heavily doped region 364 is formed in the substrate 210 by ion-implanting the substrate 210 through the second aperture 336 as shown in FIG. 5G. The second conductive dopant, such a N type dopant, of high concentration is therefore implanted into the substrate 210 except the region which is masked by the gate structure 240 and field oxide films 222, 224, and 226 so as to form the heavily doped region 364 of the source 360. A heavily doped region 354 of the drain 350 is preferably formed in the substrate 210 through another aperture 235 at the same time as shown in FIG. 5G. The second conductive dopant, such a N type dopant, of high concentration is therefore implanted into the substrate 210 except the region which is masked by the first FOX 222 and the second FOX 222 so as to form the heavily doped region 354 of the drain 350.

Figure 5H:
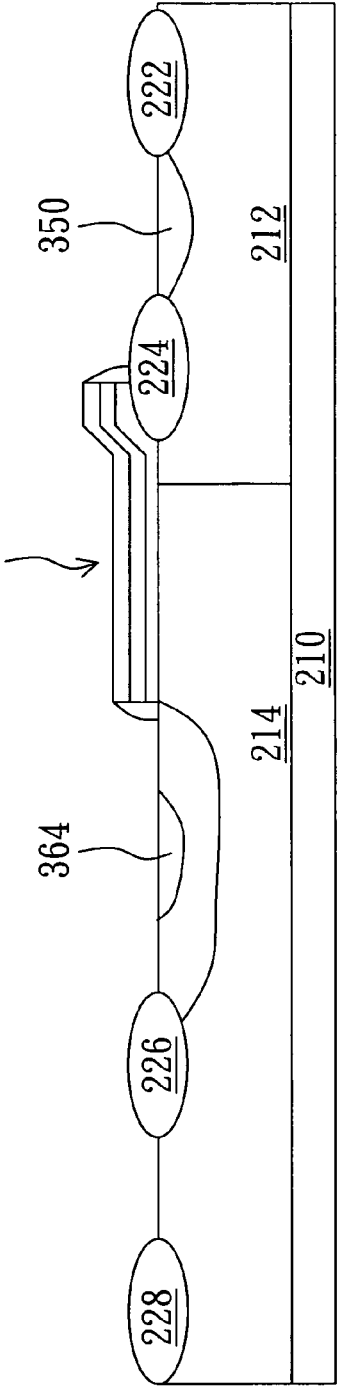

Finally, the patterned photoresist layer 334 is removed as shown in FIG. 5H. It is noted that the heavily doped region 364 of the source is shallower and narrower than the lightly doped region 362 of the source. The third FOX 326 is preferably separated from the heavily doped region 364 by a distance. More preferably, the gate structure 240 is also separated from the heavily doped region 364 by a distance.

Figure 5I:
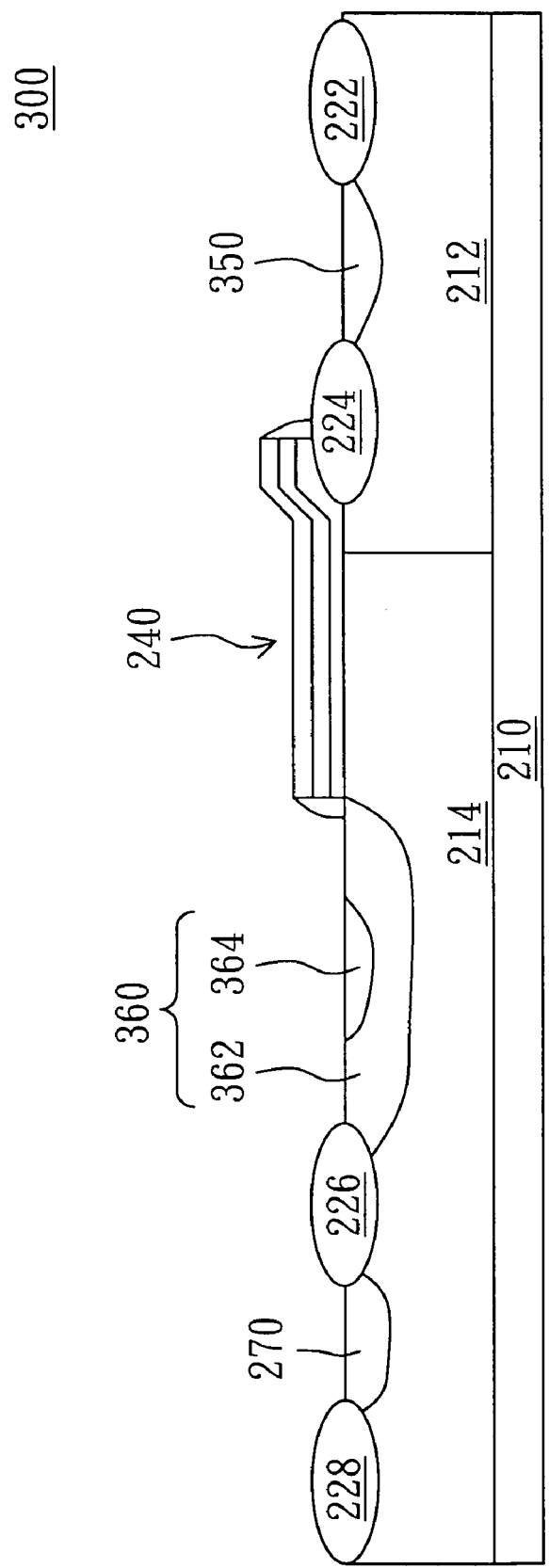

The first doped well 270 is formed by implanting the first conductive dopant, such as P type dopant, into the substrate 210, and the patterned photoresist layer 238 is removed so as to complete the laterally double diffused metal oxide semiconductor transistor 300 as shown in FIG. 5I.

Several experimental results comparing the conventional LDMOS with LDMOS of the second embodiment are listed below.

Test One

Figure 6:
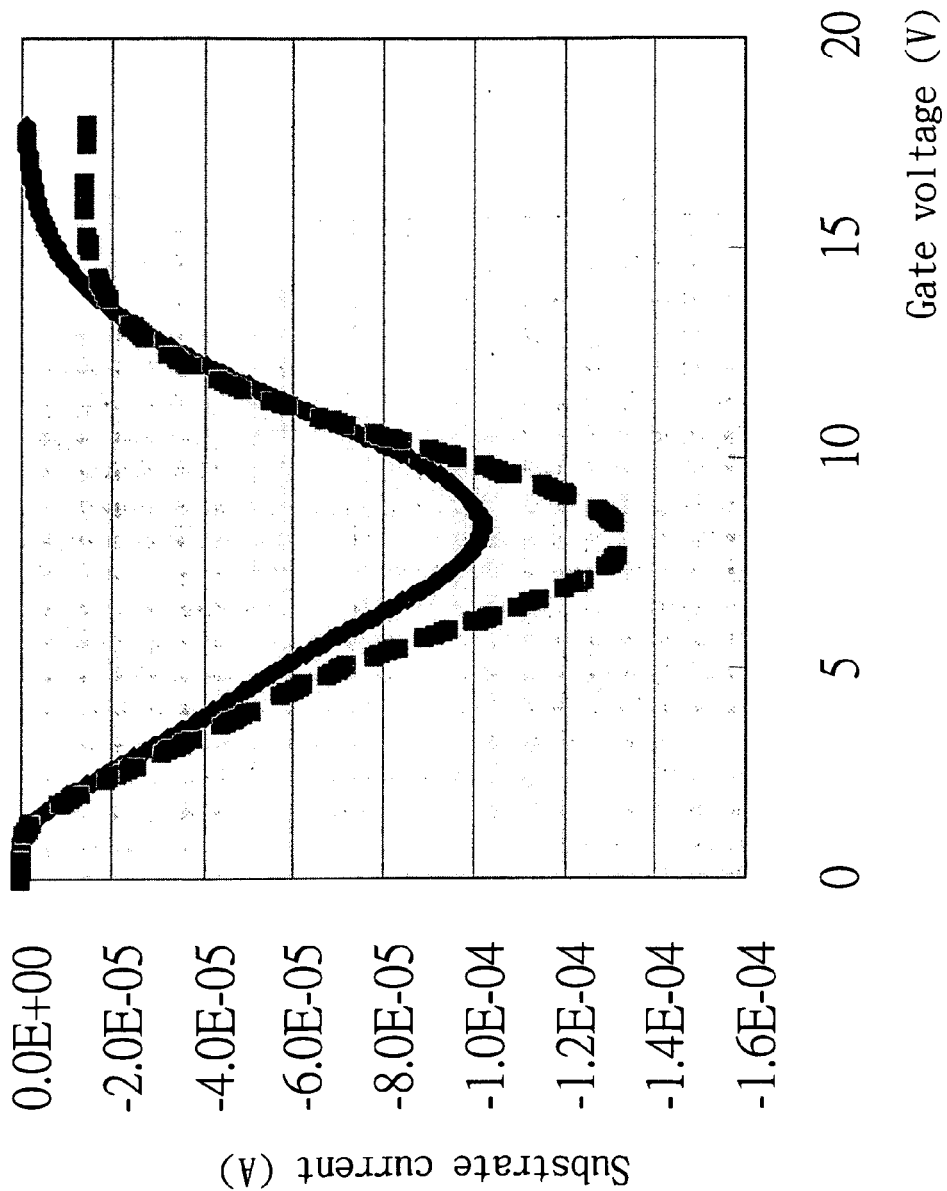
FIG. 6 schematically depicts a chart showing the substrate current and gate voltage of the conventional LDMOS and LDMOS of the second embodiment.

The goal of the test one is testing longevity of the transistor, and it is used to monitor the substrate current. Hot carrier effect is characterized by a large amount of the current generated in the substrate, and strong substrate current causes performance degeneration, deteriorates the elements and shortens the lifetime. The LDMOS is driven by an increasing gate voltage (Vg), and simultaneously substrate currents are measured as an indicator of the hot carrier effect in the experiment. The drain voltage is fixed at 22 V, and the source voltage is fixed at 0V. Referring to FIG. 6, it is a chart showing the substrate current and gate voltage of the conventional LDMOS and LDMOS of the second embodiment. The X coordinate is gate voltage, and the Y coordinate is substrate current. FIG. 6 shows that conventional LDMOS (labeled by broken line) at most generates a substrate current of $1.3 \times 10^{-4}$ A, but the LDMOS of the second embodiment only generates $1.0 \times 10^{-4}$ A when driven by the same gate voltage.

Further, LDMOS of the invention can be applied more widely because the hot carrier effect is so improved that the voltage applied on the LDMOS can be raised. For example, the source of conventional LDMOS is used to be 0V for merely grounding, but the source of the LDMOS according to the present invention is not limited thereto and can further tolerate high voltage. The longer the distance between the lightly and heavily doped regions is, the higher voltage the LDMOS can tolerate. Therefore, the source of the invention can tolerate a high voltage, preferably more than 12 V, so that it can be applied to power IC.

The laterally double diffused metal oxide semiconductor transistor (LDMOS) and method for fabricating the same disclosed in the preferred embodiments stated above has many advantages. The LDMOS has double diffused drain structure, and it allows to reduce the substrate current and to improve the hot carrier effect. In addition, the performance is improved, and operating voltage can be raised so as to allow the LDMOS to be applied into more fields.

While the invention has been described by way of examples and in terms of the preferred embodiments, it is to be understood that the invention is not limited thereto. It is intended to cover various modifications and similar arrangements and procedures, and the scope of the appended claims therefore should be accorded the broadest interpretation so as to encompass all such modifications and similar arrangements and procedures.

What is claimed is:

1. A laterally double-diffused metal oxide semiconductor transistor (LDMOS) device, comprising:
    a substrate comprising a first conductive dopant;
    a first well comprising a second conductive dopant and formed in a part of the substrate;
    a drain located in the first well;
    a second well comprising the first conductive dopant and formed in another part of the substrate, wherein the depth of the second well is substantially equal to that of the first well; and
    a source located in the second well, the source comprising a lightly doped region and a heavily doped region extending downwardly from a top surface of the substrate, wherein the lightly doped region is deeper than the heavily doped region;
    a plurality of field oxide films (FOXs) all formed on the substrate, a first field oxide film and a second field oxide film located in the first well, a third field oxide film located in the second well, wherein the third field oxide film contacts with the lightly doped region and is separated from the heavily doped region by a distance.

2. The LDMOS device according to claim 1, wherein the lightly doped region is wider than the heavily doped region.

3. The LDMOS device according to claim 1 further comprising a gate structure, disposed on a part of the substrate and a part of the second field oxide film.

4. The LDMOS device according to claim 3, wherein the gate structure comprises:
    a gate, comprising:
        a gate oxide layer, formed on the substrate and on a part of the second field oxide film;
        a polysilicon layer, formed on the gate oxide layer; and
        a metal layer, formed on the polysilicon layer; and
    a spacer formed on a sidewall of the gate.

5. The LDMOS device according to claim 3, wherein the gate structure is separated from the heavily doped region of the drain by a distance.

6. The LDMOS device according to claim 1, wherein the drain comprises:
    a lightly doped region and a heavily doped region extending downwardly from a top surface of the substrate, wherein the lightly doped region is deeper than the heavily doped region.

7. The LDMOS device according to claim 1, wherein the gate is adjacent to the lightly doped region of the source and does not extend over the source.

* * * * *